Oct. 6, 1964 YASUTOMO MIYAKE ETAL 3,152,308

TRANSISTORIZED CRYSTAL OSCILLATOR FOR VHF BAND

Filed Sept. 27, 1960

INVENTOR

YASUTOMO MIYAKE,
MASATOSHI SUYAMA,
AND TOSHIO SHINADA

BY Linton and Linton

ATTORNEYS

United States Patent Office 3,152,308
Patented Oct. 6, 1964

3,152,308
TRANSISTORIZED CRYSTAL OSCILLATOR FOR VHF BAND

Yasutomo Miyake, Yokohama, Masatoshi Suyama, Kawasaki, and Toshio Shinada, Tokyo, Japan, assignors to K.K. Kinsekisha Kenkyujo, Tokyo, Japan, a corporation of Japan Filed Sept. 27, 1960, Ser. No. 58,678
Claims priority, application Japan Oct. 5, 1959
1 Claim. (Cl. 331—116)

The present invention relates to a transistorized crystal oscillator which starts easily and works stably at a very high frequency (VHF) band of 70 megacycles or over.

A transistorized crystal oscillator for the VHF band according to the present invention comprises a transistor circuit, the value of inductance and capacitance therein taken for said circuit being tuned to a frequency of 70 magacycles or over, a crystal unit connected between the base of said transistor and earth, the load impedance of said transistor being chosen for being capacitive, a small capacitance being inserted between the emitter and the collector of said transistor, said inserted capacitance being of the order of not exceeding two picofarads (micro-micro farads) and less than ⅓ of the load capacitance of said emitter. The load impedance is preferably connected between the emitter and ground.

The reasons why no transistorized crystal oscillator which works stably in the above mentioned VHF band has been hitherto produced are based upon the performance of the crystal unit on the one hand and upon the performance of the transistor on the other hand. According to the state of the art of manufacturing of a crystal vibrator of the present day, the practical upper limit of the fundamental harmonic of vibration is about 20 megacycles, and use of frequency is necessary for making an oscillating circuit with a crystal vibrator work at higher frequencies. And especially, a third or a fifth overtone or higher is necessary to be used for having the VHF band for its working range. Under these circumstances, the resonant impedance of said crystal tends to be high, and the parallel capacitance thereof comes to exert an unfavorable effect on the oscillation, resulting in the interruption of oscillation due to a lowering in the value of merit ($1/R\omega_0C$) of said crystal. On the side of the transistor, an increase in the imaginary component of the current amplification constant in the neighbourhood of the cutoff frequency of said transistor as well as a lowering of the reactance due to inner equivalent capacitance at a very high frequency, tend to make oscillation difficult.

The features and advantages of this present invention will become apparent from the following description of the invention taken in connection with the accompanying drawings in which.

Figure 1:
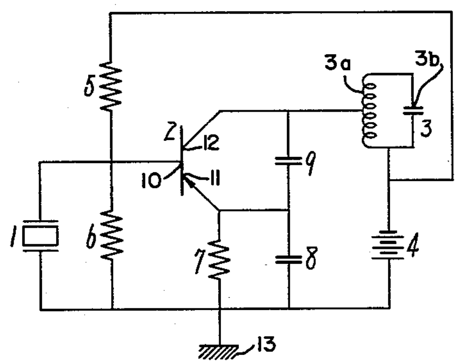
FIG. 1 is a schematic diagram of the circuit of an oscillator according to the present invention.

In FIG. 1, 1 is a crystal unit which can be tuned to 108 megacycles. 2 is a transistor with a cut-off frequency of 130 megacycles having base 10, emitter 11, and collector 12. 3 is the collector circuit of said transistor and said circuit has an inductance of 0.25 microhenry and a capacitance of 7.1 picofarads (micro-micro farads). 4 is a source of electricity. 5 and 6 are respectively a stabilizing resistance of 40 kiloohms and 2 kiloohms. 7 is a resistance of 200 ohms and which value is chosen to be higher than the value of reactance of the load condenser 8 at the above mentioned oscillating frequency. The capacitance of said condenser 8 is 11.5 micromicrofarads. This is because said condenser 8 is not inserted in the circuit of said device as by-pass condenser but is inserted for making the two terminal impedances between the emitter of said transistor and ground 13 capacitive. 9 is a condenser having a very small capacitance of 2 picofarads and which is inserted between the emitter and the collector of said transistor. Thus the capacitance of capacitor 9 is less than one-third of the capacitance of capacitor 8.

In FIG. 1 the transistor is drawn in PNP form in which the collector side is the negative terminal and the earth side is the positive terminal. But when drawn in NPN form, simply the polarity of the source of electricity should be reversed while leaving the rest of the circuit as it is.

Figure 2:
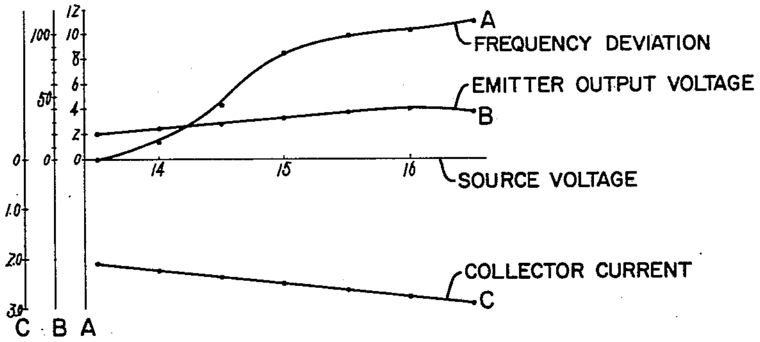
FIG. 2 and FIG. 3 are characteristic curves of an oscillator according to the present invention.

In FIG. 2 performance characteristics of the oscillator of the above description in FIG. 1 plotted against change of voltage of the source of electricity is shown in which, the horizontal scale indicates the voltage of said source of electricity in volts, the vertical scale A corresponds to the curve A and indicates the coefficient of frequency deviation in $\Delta f/f \times 10^{-6}$, where $f$ is frequency and $\Delta f$ is frequency deviation, the vertical scale B corresponds to the curve B and indicates emitter output of the transistor in millivolts, and the vertical scale C corresponds to the curve C and indicates the collector current of the transistor in milliamperes.

Figure 3:
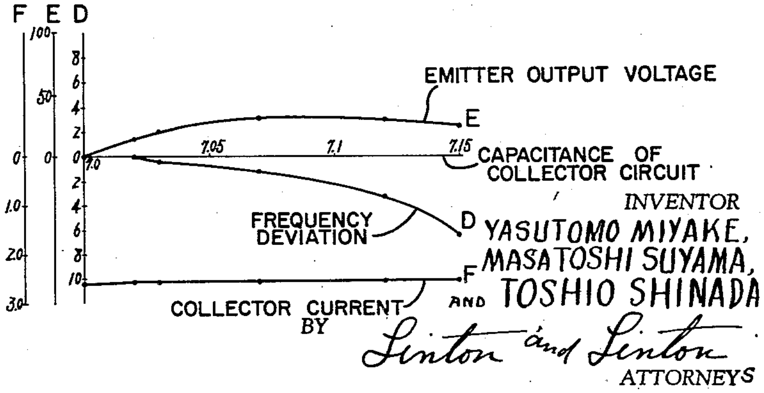

In FIG. 3 a performance characteristic of said oscillator against change of collector tuning frequency is shown in which, the horizontal scale indicates capacitance of the condenser in the collector circuit 3 in micromicrofarads, the vertical scale D corresponds to the curve D and indicates the ratio of frequency deviation in $\Delta f/f \times 10^{-5}$, the vertical scale E corresponds to the curve E and indicates emitter output voltage in millivolts, and the vertical scale F corresponds to the curve F and indicates collector current in milliamperes. Said capacitance in said horizontal scale is the substitute for the collector tuning frequency, and said frequency is for example 108 megacycles when said capacitance is 7.1 picofarads (micro-micro farads).

In a device according to the present invention, a favourable increase in the negative resistance is attained in the input circuit of the transistor on account of the load impedance of said emitter being assumed to be capacitive, and a small capacitance being inserted between the emitter and the collector of said transistor, resulting in the input reactance of said oscillator circuit being capacitive. Accordingly the crystal unit in said oscillator circuit operates as an inductive impedance, with the result that an oscillation with a harmonic of a desired order becomes possible and that the lowering of said value of merit of said crystal is compensated for. Said small capacitance which is inserted between the emitter and the collector is necessarily limited in magnitude to the above mentioned range because, out of said range, said crystal unit develops a tendency to generate parasitic oscillations on account of the reactive component of the input impedance of said crystal unit working in an inductive state in spite of some increase in the resistive component thereof. Besides, it is a profitable procedure in this invention to let the circuit of the collector work in an inductive state at the oscillating frequency of the device by taking the resonant frequency of said circuit to be somewhat higher than the natural frequency of said crystal, because the negative resistance between the input terminals of the transistor circuit increases by said choice causing the whole circuit of the device to oscillate more easily.

The present invention is possible of being applied to an oscillator intended for working in the VHF band of 70 megacycles or over. And a device according to the present invention is very stable in the performance characteristics as is shown in FIG. 2 and FIG. 3 as an example thereof and in the starting of oscillation which is easy.

Having thus described this invention what is claimed is:

A transistorized crystal oscillator for the VHF band comprising a transistor having an emitter, a base, and a collector electrode; a source of potential having one terminal connected to ground; a tank circuit consisting of an inductance and a first capacitor connected in parallel, said tank circuit being connected between said collector and the other terminal of said source of potential, and being tuned to a frequency of the order of 70 megacycles; a crystal unit connected between said base and ground; a first resistor and a second capacitor connected in parallel between said emitter and ground; a third capacitor connected between said collector and said emitter, said third capacitor being of the order of but not exceeding two micromicrofarads and less than one-third of the capacitance of said second capacitor; a second resistor connected between said other terminal of said source of potential and said base electrode; and a third resistor connected between said base and ground.

References Cited in the file of this patent

UNITED STATES PATENTS

| | | |
|---|---|---|
| 2,760,070 | Keonjian | Aug. 21, 1956 |
| 2,992,328 | Chow | July 11, 1961 |